US010162033B2

(12) United States Patent
Feiweier (10) Patent No.: US 10,162,033 B2
(45) Date of Patent: Dec. 25, 2018

(54) MAGNETIC RESONANCE IMAGING METHOD AND APPARATUS

(71) Applicant: Siemens Aktiengesellschaft, Munich (DE)

(72) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 481 days.

(21) Appl. No.: 14/921,321

(22) Filed: Oct. 23, 2015

(65) Prior Publication Data
US 2016/0116557 A1 Apr. 28, 2016

(30) Foreign Application Priority Data
Oct. 23, 2014 (DE) ...................... 10 2014 221 564

(51) Int. Cl.
*G01R 33/54* (2006.01)
*G01R 33/28* (2006.01)
*G01R 33/483* (2006.01)

(52) U.S. Cl.
CPC .......... *G01R 33/543* (2013.01); *G01R 33/288* (2013.01); *G01R 33/4835* (2013.01); *G01R 33/546* (2013.01)

(58) Field of Classification Search
CPC ............ G01R 19/0092; G01R 19/0084; G01R 21/06; G01R 19/00; G01R 15/181; G01R 31/40; G01R 27/06

USPC .............................. 324/123, 76.11, 107, 127
See application file for complete search history.

(56) References Cited

U.S. PATENT DOCUMENTS

| 2010/0286802 A1 | 11/2010 | Feiweier et al. |
| 2011/0172515 A1 | 7/2011 | Fautz et al. |
| 2013/0225975 A1* | 8/2013 | Harvey ............... A61B 5/0037 600/411 |
| 2013/0225978 A1* | 8/2013 | Remmele ............. A61M 16/01 600/420 |
| 2015/0084627 A1 | 3/2015 | Ruhm et al. |
| 2015/0260808 A1* | 9/2015 | Katscher ............ G01R 33/4833 324/309 |

* cited by examiner

Primary Examiner — Giovanni Astacio-Oquendo
(74) Attorney, Agent, or Firm — Schiff Hardin LLP (57) ABSTRACT

A magnetic resonance image is generated by executing a scan sequence that is determined by at least one scan parameter. A first value of the at least one scan parameter is determined for a first subregion of an examination region, and a second value of the at least one scan parameter is determined for a second subregion of the examination region. The determination of the first value and the determination of the second value is implemented so that a value of a physical variable influenced by the first value and the second value of the at least one scan parameter does not transgress a pre-set threshold value. Subsequently, the scan sequence is executed by a magnetic resonance scanner and a magnetic resonance image is generated. The threshold value can be based, for example, on technical efficiency of the scanner and/or a physiological limitation of an examination object.

16 Claims, 5 Drawing Sheets

MAGNETIC RESONANCE IMAGING METHOD AND APPARATUS

BACKGROUND OF THE INVENTION

Field of the Invention

Different embodiments of the invention concern a method and system for generating a magnetic resonance image. In particular, different embodiments of the invention concern techniques by which a value of a scan parameter that determines the scan sequence is determined for a first subregion and a second subregion of an examination region.

Description of the Prior Art

In magnetic resonance (MR) imaging, structures in an examination region of an examination object, for example, a patient, can be made visible. One type of MR imaging is MR spectroscopy. With MR spectroscopy, particular result values, for example, a fat or water proportion of a tissue, can be determined and made visible.

Technical and physiological limitations play a large part in a number of techniques for MR imaging. In general, limitations of this type lead to a restriction of the efficiency when a corresponding scan sequence is carried out; this can be because particular scan parameters of the scan sequence cannot be selected, or can be selected only to a limited extent. For example, it may be necessary for compromises to be made regarding the duration of the scan (scan time) or the quality of the MR image. The quality of the MR image is determined, for example, by the signal-to-noise ratio (SNR) or the contrast of the MR image. The contrast is a measure for the differentiability of different tissue properties in the MR image or in an MR spectrum. A relatively large SNR and contrast of an MR image can signify, for example, that a relatively large information content is available for the imaged anatomy in the MR image.

Different approaches are known for achieving the maintenance of the technical and/or physiological limitations. For instance, it is known to restrict a parameter space which is available for the selection of the scan parameters before carrying out the scan sequence. As early as the creation of the scan protocol by the user or by an automated procedure, the scan sequence can be checked for possible non-adherence to the technical and/or physiological limitations. Scan parameters which would have the consequence of corresponding pre-set threshold values not being adhered to are then either offered for setting or are optionally rejected as being invalid.

It is known, as a further approach, before the performance of the scan sequence to check the scan parameters that have been set. Typically herein, the finished scan protocol is checked immediately before the start of the performance of the scan sequence for the possible overshooting of technical and/or physiological limitations. If an overshoot is determined, the scan sequence cannot be carried out. Then, typically a restricted selection of changes to the scan parameters with which the scan sequence can be carried out is automatically proposed to the user and simultaneously, the corresponding pre-set threshold value can be adhered to.

SUMMARY OF THE INVENTION

There is therefore a need for techniques for MR imaging that at least lessen some of the aforementioned disadvantages and limitations. There is a need, in particular, for techniques that provide an improved scanning efficiency.

According to one aspect, the present invention concerns a method for determining an MR image by executing a scan sequence with an MR scanner. The MR image maps an examination region of an examination object. The scan sequence is determined by at least one scan parameter. The method includes the determination of a first value of the at least one scan parameter for a first subregion of the examination region and the determination of a second value of the at least one scan parameter for a second subregion of the examination region by the operation of at least one computer. The determination of the first value and the determination of the second value are made so that a value of a physical variable influenced by the first value and the second value of the at least one scan parameter contains a pre-set threshold value. The method also includes the performance of the scan sequence by a transmitting/receiving unit and by means of a gradient system. The performance of the scan sequence takes place with the first value of the at least one scan parameter in the first subregion and with the second value of the at least one scan parameter in the second subregion, in order to obtain MR data for the examination region. The method also includes the determination of the MR image based on the MR data by means of the at least one computer unit.

The method can further include, for example, obtaining the pre-set threshold value based on the technical efficiency of the MR system and/or based on a physiological limitation of the examination object.

For example, the examination object can be a test person or a patient. In general, a variety of scan sequences can be used. For example, a turbo spin echo (TSE) scan sequence can be used. It is also possible to use a gradient echo (GRE) scan sequence. The scan sequences can be used in the context of functional MR imaging (fMRI), chemical-shift MR imaging, perfusion MR imaging and/or other techniques, thus also in the area of MR spectroscopy.

Depending on the manner and type of scan sequence used, different scan parameters can determine the scan sequence. The at least one scan parameter can be selected from the set of all scan parameters that determine the scan sequence. The at least one scan parameter is often designated the setting parameter of the corresponding MR system.

The examination region can be a particular region of the examination object; for example, the examination region can contiguously encompass an anatomically relevant region of the examination object. The examination region includes the first subregion and the second subregion. The first subregion and/or the second subregion can include contiguous regions of the examination object. The first subregion can be different from the second subregion, and therefore not overlap therewith. The first subregion and the second subregion can be arranged adjacent to one another.

For example, suitable control data can be determined, which are designated as effective volume position data. These control data can define the first subregion and the second subregion and can have a corresponding association with the first value of the at least one scan parameter and with the second value of the at least one scan parameter.

The spatially resolved determination of the first value of the at least one scan parameter and of the second value of the at least one scan parameter can also be designated the implementation of a first and second functional subsequence of the scan sequence. These functional subsequences can thus be optimized with regard to adherence to the threshold value, which is based on the technical and/or physiological limitation.

The technical efficiency can denote, for example, an efficiency of the transmitting/receiving unit and/or of the gradient system. In order to adhere to the technical specifications of the transmitting/receiving unit and/or of the gradient system, it may be necessary for the value of the physical variable to adhere to the pre-set threshold value.

The physical variable can alternatively or additionally also denote a physiological limitation of the examination object. Execution of the scan sequence may result in side-effects that affect the examination object. For example, it may result in the stimulation of nerve pathways or force effects or heating of tissue. In order to restrict these side effects to an acceptable level, it may be necessary for the value of the physical variable to adhere to the pre-set threshold value.

The physical variable can also be designated a global variable—this is the case since the physical variable is influenced both by the first value—determined locally for the first subregion—and also by the second value—determined locally for the second subregion—of the at least one scan parameter. Accordingly, the technical efficiency and/or the physiological limitation or the pre-set threshold value can also be defined globally.

The pre-set threshold value can be defined, for example, by a user via a user interface of the MR system, i.e., it is obtained from the user interface. It is also possible for the pre-set threshold value to be deposited in a memory store and obtained from the memory store. It is also possible for the threshold value to be determined on the basis of scan data; the scan data can relate, for example, to a current operating state of the MR system.

Through the determination of the first value the at least one scan parameter for the first subregion and the determination (for example, an independent determination) of the second value of the at least one scan parameter for the second subregion, a parameter space of the possible values of the at least one scan parameter can be enlarged by execution of the scan sequence. By this means, it may be possible to select the first value of the at least one scan parameter and the second value of the at least one scan parameter in a particularly flexible manner. By this means, it may also be possible, firstly, to ensure that the value of the physical variable adheres to the pre-set threshold value and, secondly, that the highest possible quality of the MR image and/or a shortest possible overall scan time is achieved.

It is possible that in one of the subregions, such as in the first subregion, a first value of the at least one scan parameter which is sub-optimal with regard to the quality of the MR image, is selected. Then, the quality of the MR image can still be acceptable overall, even taking account of the second subregion, particularly where the information content obtained is concerned, while at the same time the pre-set threshold value is adhered to by the physical variable. The information content contained in the MR image for the first subregion can then be smaller than the information content contained in the MR image for the second subregion.

Techniques of this type are based on the recognition that for a user, not necessarily all the imaged regions of the examination region have a similarly high level of relevance. For example, in the border regions of the examination region, a particularly high quality of the MR image may be unnecessary. For example, the edge region may be mapped by the first subregion.

It is possible to communicate to the user which region of the MR image has a reduced information content. For example, the method can also include the indication of the first subregion and/or the second subregion in the MR image. The indication can be made, for example, by suitable graphical emphasis. Corresponding control data or metadata which comprise the information concerning the first subregion and the second subregion can also be associated with the MR image. Through, the provision of this information to the user, the user does not falsely assume that the first subregion also contains particular information; so faulty diagnoses can be prevented. Technical usability of the MR image is increased.

For example, it may be possible that the first value of the at least one scan parameter causes a reduced MR image quality in the first subregion as compared with a quality of the MR region in the second subregion that is caused by the second value of the at least one scan parameter.

It may be possible to flexibly select a degree of reduction in the quality in the first subregion as compared with the second subregion (quality reduction factor). For example, the quality reduction factor can be selected such that localization of relevant anatomy by the user and/or subsequent analysis steps (anatomical orientation) is still possible on the basis of the information reproduced for the first subregion in the MR image; at the same time, the quality reduction factor can be selected such that a diagnostic exploitation—beyond the anatomical orientation—is not, or only to a limited extent, possible on the basis of the information produced for the first subregion in the MR image. For example, the quality reduction factor can be selected such that reliable quantitative statements concerning the resultant value determined can no longer be made in the MR spectroscopy.

It may be possible to take account of a proportion of signal-generating material in the first subregion. For example, the determination of the first value of the at least one scan parameter can take account of signal-generating material in the first subregion. For example, the quality-reduction factor can be determined depending on the proportion of signal-generating material in the first subregion.

For example, it is possible, if the first subregion contains no significant signal-generating tissue portions, to reduce the at least one scan parameter as far as possible: e.g. amplitudes of radio-frequency (RF) pulses could be reduced to 0 and/or amplitudes of gradient pulses could be reduced to 0. This corresponds to a large quality reduction factor. Moreover, it is possible, if signal-generating tissue portions are present to a significant degree in the first subregion, to reduce the at least one scan parameter so far that a spatial association of imaged information to a position within the examination object is retained. In this way, the anatomical orientation can still be carried out. This can mean, for example, that gradient pulses which are used for position encoding can be adjusted not at all or only with accompanying measures in relation to the high quality. At the same time, in such a case, the at least one scan parameter can be determined such that the quality of the MR image for the first subregion is sufficient. For example, the quality reduction factor with regard to the SNR can be smaller than or equal to a factor of 10. Depending on the MR imaging technique, that is, for example TSE or GRE, an amplitude can be determined thereby for the RF excitation pulses used.

In general, the determination of the first value and/or the determination of the second value of the at least one scan parameter can be carried out in a variety of ways. For example, the first value and/or the second value of the scan parameter could be calculated on the basis of a pre-set function. For example, the pre-set function can take account of the pre-set threshold value as input. The function can also take account input entry, for example, of a user specification, for example, a desired resolution, a slice number, a scan time, a type of scan sequence to be used, etc. The function can then be configured such that on using the function, the first value and the second value of the at least one scan parameter are determined such that they adhere to the pre-set threshold value.

It is also possible for the first value and the second value of the at least one scan parameter to be determined by means of iterative techniques. For example, the first values and/or the second value can be repeatedly adjusted until the physical variable adheres to the pre-set threshold value. This can be, for example, the use of an optimization technique.

It is also possible for the determination of the first value and the determination of the second value of the at least one scan parameter to comprise the obtaining of a candidate value of the at least one scan parameter and the determination of the value of the physical variable based on the candidate value of the at least one scan parameter. The determination of the first value and the determination of the second value of the at least one scan parameter can then also be the performance of a threshold value comparison between the determined value of the physical variable and the pre-set threshold value and, depending on the performance of the threshold value comparison, the selective adjustment of the candidate value in the first subregion to obtain the first value of the at least one scan parameter and the use of the candidate value in the second subregion as the second value of the at least one scan parameter.

For example, the candidate value can be constant and equal in the first subregion and the second subregion. It can therefore be checked for the candidate value whether with the candidate value, the value of the physical variable adheres to the pre-set threshold value. If the performance of the threshold value comparison produces the result that the value of the physical variable adheres to the pre-set threshold value, it is possible that the candidate value in the first subregion is used as the first value of the at least one scan parameter and, in the second subregion, is used as the second value of the at least one scan parameter. However, if the performance of the threshold value comparison produces the result that the value of the physical variable does not adhere to the pre-set threshold value, then the candidate value can be selectively adjusted in the first subregion for the first value of the at least one scan parameter.

In other words, for example, the scan protocol can be planned with conventional techniques. The scan sequence can be planned with the at least one scan parameter which is stipulated by means of the candidate value. If the candidate value does not meet the requirements with regard to the technical and/or physiological limitation, a local adjustment can take place by adjusting the first value in the first subregion. The second value can herein remain unadjusted, that is, selected to be equal to the candidate value.

By means of such techniques, it can be achieved that the candidate value is adjusted as little as possible; in particular, it can be achieved that the candidate value is preferably adjusted in the first subregion and is not adjusted in the second subregion. By this means, the quality of the MR image is retained in the second subregion.

It is, for example, possible that the candidate value of the at least one scan parameter determines a scan sequence that is optimized with regard to the quality and/or the scan time. Through the selective adjustment of the candidate value in the first subregion, it can be achieved that the optimized candidate value can still be used in the second subregion and nevertheless, at the same time, the pre-set threshold value is not exceeded by the value of the physical variable. It is, for example, possible that the candidate value is determined by means of conventional techniques, for example, based on a user input. Techniques for determining the candidate value are known, for example, from the published German patent application DE 10 2009 020 661 A1.

In general, highly varied techniques can be used for determining the first subregion and for determining the second subregion. The method can further include the determination of the first subregion and the determination of the second subregion based on at least one of an anatomical landmark recognition in reference image data of the examination region and a user input at a user interface of the MR system by means of the at least one computer.

For example, the method can further include acquisition of the reference image data by carrying out a further scan sequence. For example, the further scan sequence can comprise, as compared with the scan sequence, a reduced resolution and/or a reduced scan time. The reference image data can be suitable for anatomical orientation.

For example, the user input can relate to a choice or selection of the first subregion or of the second subregion in the reference image data.

By means of such techniques, it is possible to determine the first subregion and/or the second subregion on the basis of the information content of the MR image to be expected in the respective subregions. Depending on whether the respective information content is particularly relevant or less relevant for a user of the MR system, the first subregion or the second subregion can be determined.

The determination of the first subregion and the determination of the second subregion can be undertaken, in particular, such that the second subregion contains a structure of the examination object to be imaged which is arranged in the examination region and that the first subregion contains a surrounding area region of the structure to be imaged. Typically, it can be desirable that a full information content relating to the structure to be imaged in the MR image is made available to the user. However, it may be unnecessary for the full information content to be available in the surrounding region of the structure to be imaged; e.g. it may be unnecessary for a quality of the MR image to be relatively high in the surrounding region. However, the surrounding region can typically serve for anatomical orientation regarding the placement of the structure to be imaged; it may therefore be desirable for position information to remain in the MR image in the first subregion.

In an embodiment, it is possible for the first value of the at least one scan parameter to be selected constant in the first subregion. Accordingly, it is possible for the second value of the at least one scan parameter to be selected constant in the second subregion.

In a further embodiment, it is also possible for the first value of the at least one scan parameter to be selected spatially resolved in the first subregion. It may then be possible for the first value of the at least one scan parameter to vary as a function of the position in the first subregion. The same applies also for the second value of the at least one scan parameter in the second subregion.

In this way, it is possible to select the first value of the at least one scan parameter in a particularly flexible manner. By this means, it may also be possible, in the most varied of scenarios, to ensure that the value of the physical variable adheres to the pre-set threshold value.

A scenario was described above in which—based on a ready planned scan protocol—a candidate value of the at least one scan parameter is adjusted. In such a scenario, also, the adjustment of the candidate value can take place spatially resolved in the first subregion. The adjustment of the candidate value in the first subregion can be carried out by a larger amount the greater a distance of a corresponding position point in the first subregion is from the second subregion.

The distance from the second subregion can be stipulated, for example, in relation to an edge of the second subregion or a mid-point of the second subregion, etc.

Such techniques can be desirable for the event that the candidate value is optimized with regard to a quality and/or a scan time of the scan sequence. Specifically then it can be achieved that the value of the physical variable adheres to the pre-set threshold value, while at the same time, a deviation from the candidate value optimized with regard to the quality and/or scan time is reduced close to the second subregion. By this means, the information content that is made available to a user through the MR image can be relatively large. Furthermore, for example, an abrupt jump in the quality can be prevented, which can increase the overall intelligibility and technical evaluability of the MR image.

Widely varying techniques for determining the at least one scan parameter have been discussed above such that the value of the physical variable adheres to the pre-set threshold value. It is, in general, possible to apply suitable techniques for the most varied of scenarios, i.e. different types of scan sequences and types of scan parameters. Purely exemplary implementations relating to the at least one scan parameter and the physical variable will now be discussed.

For example, the at least one scan parameter can be selected from the following group and can influence the following physical variable: an amplitude of an RF pulse and mean RF energy; a duration of the RF pulse and the mean RF energy; a dead time and the mean RF energy; a pulse form of the RF pulse and the mean RF energy; a number of RF pulses and the mean RF energy; a transmitter array setting of the RF pulse and the mean RF energy; an amplitude of a gradient pulse and the mean field strength of a gradient field; a dead time and the mean field strength of the gradient field; a duration of a gradient pulse and the mean field strength of the gradient field; a pulse form of the gradient pulse and the mean field strength of a gradient field; a gradient offset current for compensating for a field inhomogeneity and the mean field strength of the gradient field; and echo time and the mean field strength of the gradient field; a slice thickness of slices for which the MR data are acquired and a mean rate of change of the field strength of the gradient field; the echo time and the mean rate of change of the field strength of the gradient field; a rate of change of the amplitude of the gradient pulse and the mean rate of change of the field strength of the gradient field; a dead time and the mean rate of change of the gradient field; a sequence with which the MR data are acquired for different slices, and the mean radio-frequency energy.

From the above, it is apparent that, in general, a particular physical variable can be influenced by a number of scan parameters. Therefore, a number of possibilities can exist in order to achieve adherence to the threshold value.

It can be the case that the at least one scan parameter does not act uniformly on all the different gradient pulses and/or RF pulses of the scan sequence. It is possible, for example, for the at least one scan parameter to relate only to a subset of the gradient pulses and/or RF pulses that are used.

Advantageously, the gradient pulse is selected from the following set: a spoiler gradient pulse; a preparation gradient pulse. Typically, the spoiler gradient pulse and the preparation gradient pulse do not, or not significantly, influence a position encoding of the MR image. This can have the effect that position information of the MR image is not, or not significantly, influenced by the corresponding determination of the first value of the scan parameter in the first subregion. By this means, it is possible for a user to use the information of the MR image in the first subregion for anatomical orientation.

The RF pulse can be selected, for example, from the following set: RF excitation pulse; RF refocusing pulse; RF preparation pulse.

The techniques described above are based on the realization that a local adjustment of the second value of the at least one scan parameter can also have the effect in the second subregion that the value of the physical variable adheres to the threshold value. This is the case since the physical variable can be determined, for example, integrated globally over position and/or time.

A global variable determined over time can correspond, for example, to an integration over time. Herein, the integration of a local physical variable can be carried out over a particular time duration; this time duration can lie in the order of a particular time scale, which is as large as the repetition time or is greater than the repetition time.

For example, the execution of the scan sequence can take place with a repetition time for a plurality of slices in the examination region. The physical variable can describe an integration in the time space wherein the integration takes place on a time scale which lies in the order of, or is larger than, the repetition time.

For example, the first subregion can be a first number of slices; the second subregion can accordingly be a second number of slices. For the acquisition of MR data for a particular slice, a particular time duration which is smaller than the repetition time may be needed. Following the repetition time, MR data are acquired for a next slice. The repetition time can lie, for example, in the order of a few seconds or a fraction of a second. For example, the repetition time can amount to from 1 ms to 10 ms.

For example, the mean RF energy or the mean field strength of the gradient field describe an averaging of the order of the scan time. For example, a mean RF energy which exceeds the pre-set threshold value can cause the transmitting/receiving unit or surrounding components of the MR system—seen over the measuring time or a multiple of the repetition time—to become excessively heated. At the same time, it is possible that, due to the corresponding biologically applied RF energy (specific absorption rate, SAR) tissue of the examination object becomes excessively heated, seen over the scan time or a multiple of the repetition time. In such cases, a local adjustment of the at least one scan parameter, for example, by providing additional dead times or a reduced amplitude of the RF pulse, can selectively bring about in the second subregion that the value of the physical variable adheres overall to the pre-set threshold value.

Scenarios have been described above in which the physical variable corresponds to an integration in the time space. Accordingly, the physical variable can also correspond to integration in position space. In general, an integration in the time space can also be expressed as an integration in the position space and vice versa; this can be the case, in particular, if an association is known between slices and a duration for acquisition of MR data for the slices.

The physical variable can alternatively or additionally denote an integration in the position space. The integration can take place on a length scale which lies in the order of, or is greater than, the examination region.

By means of the techniques for integration in the position space and/or in the time space described above, a local adaptation can be achieved as to the influence that the first value of the at least one scan parameter in the first subregion exerts on the globally determined physical variable, which is influenced both by the first value of the at least one value of the at least one scan parameter, as well as by the second value of the least one scan parameter. This can permit the second value of the scan parameter to be selected particularly flexibly in the second subregion—particularly optimized with regard to a quality of the MR image.

According to a further aspect of the present invention, an MR system is configured for determining an MR image by carrying out a scan sequence. The MR image maps an examination region of an examination object. The scan sequence is determined by at least one scan parameter. The MR system has at least one computer unit and a transmitting/receiving unit and a gradient system. The at least one computer is configured to determine a value of the at least one scan parameter for a first subregion of the examination region and a second value of the at least one scan parameter for a second subregion of the examination region. The determination of the first value and the determination of the second value take place in that a value of a physical variable influenced by the first value and the second value of the at least one scan parameter contains a pre-set threshold value. The transmitting/receiving unit and the gradient system are components of a magnetic resonance scanner that is operated by the computer to carry out the scan sequence. The performance of the scan sequence takes place with the first value of the at least one scan parameter in the first subregion and with the second value of the at least one scan parameter in the second subregion in order to obtain MR data for the examination region. The at least one computer unit is further configured in order to determine the MR image based on the MR data.

In general, the MR system can be configured according to the aspect is operated by configuration of the at least one computer, to carry out the method for determining an MR image according to the present invention.

For an MR system of this type, results can be achieved that are comparable to the results achieved by the method for determining an MR image according to the present invention.

DESCRIPTION OF THE PREFERRED EMBODIMENTS

The present invention will now be described in greater detail on the basis of preferred embodiments and making reference to the drawings. In the drawings, the same reference signs denote the same or similar elements. The figures are schematic representations of different embodiments of the invention. Elements shown in the drawings are not necessarily shown to scale. Rather, the different elements shown in the drawings are reproduced so that their function and general purpose are comprehensible to a person skilled in the art. The links and couplings shown in the figures between the functional units and elements can also be implemented as indirect links or couplings. A link or coupling can be implemented wire-bound or wirelessly. Functional units can be implemented as hardware, software or a combination of hardware and software.

Techniques that enable an improved scan sequence for determining an MR image which maps an examination region will now be illustrated. According to the techniques described herein, a first value for at least one of the scan parameters in a first subregion of the examination region can be determined and a second value of the at least one scan parameter in a second subregion of the examination region can be determined. The at least one scan parameter can therefore be determined locally. The scan sequence is typically determined by a number of scan parameters. Therefore, reference is often made below, but without restriction, to a number of scan parameters, wherein in general, only one scan parameter can be taken into account.

By the local determination of the scan parameters, it is possible to adhere to a technical efficiency and/or a physiological limitation which is available, for example, in the form of a pre-set threshold value—wherein at the same time, in the particularly relevant subregions of the MR image, a relatively high quality of the MR image can be obtained. In particular, the technical efficiency and/or the physiological limitation can be globally defined, i.e. integrated over time and/or position.

The techniques according to the invention enable an improvement of the scan sequence, particularly in such cases in which a relevant time constant of the technical efficiency and/or of the physiological limitation is larger than a characteristic duration of the scan time, in particular, larger than a repetition time for acquiring MR data for different slices for which MR data are acquired.

As an example, in the following, physical variables in the form of technical or physiological limitations are cited which typically play a significant role in the execution of the scan sequence and whose time constants lie in the range of the usual repetition time. Typically, the repetition time lies between a millisecond and a second.

The physical variable can be the mean RF energy as a technical efficiency relating to the maximum amplification of the radio-frequency and loading capacity of a corresponding RF coil and of the RF amplifier(s). For example, the mean RF energy is influenced by an amplitude of the RF pulses used, a duration of the RF pulses used, a pulse form of the RF pulses used, a transmission array setting of an RF coil arrangement of the MR system of the RF pulse and a dead time between the RF pulses used. The mean RF energy typically also represents a physiological limitation relating to the SAR. A mean field strength of a gradient field represents a technical efficiency relating to a maximum amplification of a corresponding gradient system and a loading capacity of a corresponding gradient coil. The mean field strength of the gradient field is typically influenced by the amplitude, the duration and the pulse form of the gradient pulses used. Furthermore, gradient offset currents which are used to compensate for inhomogeneities, for example, of the main magnetic field have an influence on the mean field strength of the gradient field. A mean rate of change of the field strength of the gradient field typically represents a physiological limitation regarding stimulations of nerve pathways. The mean rate of change of the field strength of the gradient field is typically influenced by the rate of change of the amplitude of the gradient pulses used and possibly by correspondingly provided dead times.

By means of the local determination of the scan parameters, it is then possible that a first value is determined for the scan parameters for a first subregion of the examination region and a second value of the scan parameters is determined for a second subregion of the examination region. In particular, it is possible for the first value to be different from the second value. The determination of the first value and the determination of the second value take place in that the value (values) of the physical variable(s) influenced by the first value and the second value of the scan parameters contain(s) a corresponding pre-set threshold value.

If for example, the threshold values for the mean RF energy threaten to be exceeded, the first value of the dead time can be determined accordingly—which corresponds, for example, to an extended duration for acquisition of the MR data in the first subregion, so that movement artifacts can appear more strongly here. Alternatively or additionally, the first value of the amplitude of the RF pulse used could be reduced—which corresponds to a reduced contrast in the MR image or a lower SNR in the MR image in the first subregion. Alternatively or additionally, it is possible to reduce the first value for the number of RF pulses; this can be achieved, for example, in that a spatial resolution or a number of slices for which MR data are acquired in the first subregion is reduced.

If, for example, the pre-set threshold value for the mean field strength of the gradient field threatens not being adhered to, then the first value for the dead time can be increased—which results in a longer scan time for the first subregion and can increase movement artifacts there again. Alternatively or additionally, the echo time in the first subregion can be increased—which brings about a worsened contrast of the MR image in the first subregion. The latter can be possible or effective, for example, particularly for diffusion imaging.

If, for example, a pre-set threshold value relating to the mean rate of change of the field strength of the gradient field threatens being exceeded, it may be required to determine the first value of the echo time relatively large—which brings about a reduced contrast of the MR image in the first subregion. Alternatively or additionally, the first value of a slice thickness of slices used can be increased—which brings about a reduced spatial resolution of the MR image in the first subregion.

It is apparent from the above that often a trade-off is required between the quality of the MR image on one side and the observance of the pre-set threshold value by the value of the physical variable on the other side. The local determination of the value of the scan parameters can bring about a reduced quality of the MR image in the first subregion—particularly in comparison with a quality of the MR image in the second subregion, which is brought about by the second value of the scan parameter. Then, the techniques described here can enable the pre-set threshold value to be adhered to globally—with simultaneously improved scan efficiency as compared with known techniques wherein the scan parameter is determined globally—and not locally—for observing the technical efficiency and/or the physiological limitation.

Regarding the quality of the MR image, the first value of the at least one scan parameter can be selected to be suboptimal. By this means, it may be possible for the value of the physical variable to adhere to the pre-set threshold value. Such techniques rely on the recognition that the examination region mapped by the MR image—which is determined, for example, by a number of slices in a two-dimensional multi-slice scan—is often selected significantly larger than the region relevant for the diagnosis. The additional coverage of subregions of the examination object is needed, for example, in order to enable a clear localization of the anatomy, which is for anatomical orientation. In standardized scan protocols in the clinical environment, also, it can occur that the examination region mapped by the MR image is larger than the object to be imaged, so that in edge regions, either diagnostically unimportant anatomical regions, are localized, or even only noise and no signal portions are included.

In such cases as described above, it is possible for local compromises to be entered into with regard to the edge regions in respect of the quality of the MR image in order thereby to achieve that the value of the physical variable adheres to the globally pre-set threshold value.

Figure 1:
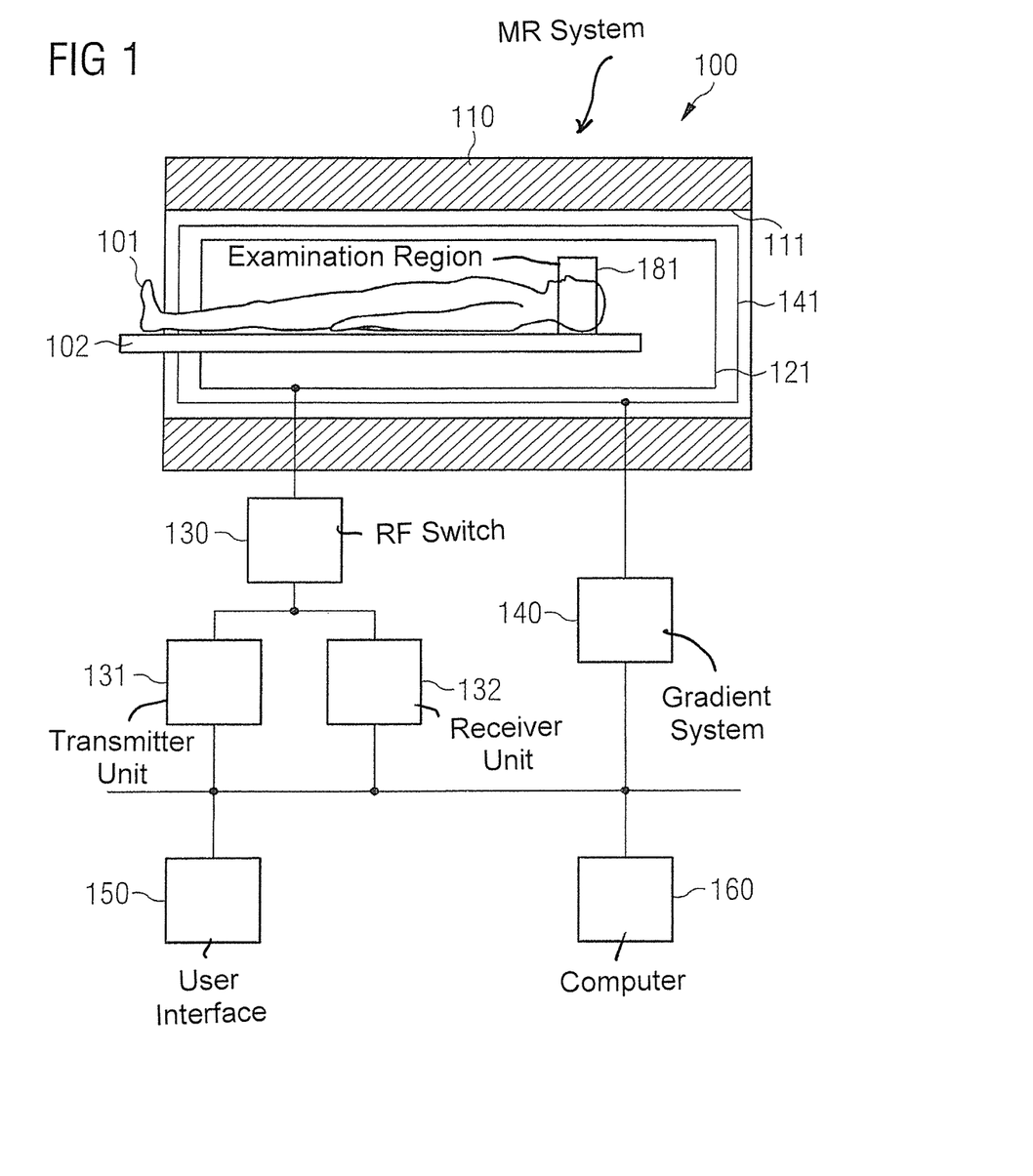
FIG. 1 schematically illustrates an MR system.

Such techniques can be implemented, for example, by an MR system 100 as shown in FIG. 1. The MR system 100 has a scanner 110 with a basic field magnet that defines a tube 111. The basic field magnet of the scanner 110 generates a basic magnetic field parallel to its longitudinal axis. The basic magnetic field may have inhomogeneities, that is, local deviations from a target value. An examination object, in this case a person 101 under examination, can be moved into the tube 111 on a patient table 102. The MR scanner 110 also has a gradient system 140 for generating gradient fields that are used for MR imaging and for spatial encoding of acquired raw data. Typically, the gradient system 140 operates at least three gradient coils 141 that are individually controllable and positioned in a well-defined way. The gradient coils 141 enable gradient pulses to be applied and switched along particular spatial directions (gradient axes); the gradient pulses bring about a gradient field in the region of the person 101 under examination. The gradient fields can be used, for example, for slice selection, for frequency encoding (in the readout direction) and for phase encoding. In this way, spatial encoding of the raw data can be achieved. The spatial directions that respectively proceed parallel to slice selection gradient fields, phase-encoding gradient fields and readout gradient fields, need not necessarily be coincident with the machine coordinate system. Rather, they can be specified, for example, in relation to a k-space trajectory which itself can be specified on the basis of particular requirements of the respective MR scan sequence and/or on the basis of anatomical properties of the person 101 under examination.

For excitation of nuclear spins in the person 101 so as to cause the excited spins to deviate from the polarization or orientation (magnetization) produced in the basic magnetic field in the longitudinal direction, an RF coil arrangement 121 is provided that radiates a modulated RF excitation pulse into the person 101 under examination. This causes a transverse magnetization to be generated. In order to generate RF excitation pulses of this type, an RF transmitter unit 131 is connected via an RF switch 130 to the RF coil arrangement 121. The RF transmitter unit 131 can include an RF generator and an RF modulation unit. The RF excitation pulses can tilt the transverse magnetization one-dimensionally slice-selectively or two-dimensionally/three-dimensionally positionally selectively or globally out of the rest position.

Furthermore, an RF receiving unit 132 is coupled via the RF switch 130 to the RF coil arrangement 121. By means of the RF receiving unit 132, MR signals of the relaxing transverse magnetization can be acquired as MR data, for example, by inductive coupling into the RF coil arrangement 121. The MR data can map an examination region 181. The MR data can correspond to the raw data, but it is also possible for the raw data to be further processed in order to obtain the MR data. For example, the raw data present in k-space can be Fourier transformed in order to obtain MR image data in the image domain.

It is possible, in general, to use separate RF coil arrangements 121 for radiating in the RF excitation pulses by means of the RF transmitter unit 131 and for acquisition of the MR data by means of the RF receiver unit 132. For example, for radiating in RF pulses, a volume coil 121 can be used and for the acquisition of raw data, a surface coil (not shown), which consists of an array of RF coils can be used. For example, the surface coil for the acquisition of raw data can consist of 32 individual RF coils and can therefore be particularly suitable for techniques of parallel imaging. A transmission coil can also be constructed as an array with a number of elements. Suitable techniques are known to those skilled in the art, so that further details need not be described herein.

The MR system 100 also has a user interface 150 that can include, for example, a screen, a keyboard, a mouse, etc. Via the user interface 150, user inputs can be acquired and outputs to the user can be presented. For example, it is possible, via the user interface 150, to set individual operating modes or operating parameters of the MR system 100 via the user and/or automatically and/or under remote control.

Furthermore, the MR system 100 has a computer 160. The computer 160 is configured to carry out various calculation operations in the context of the determination of scan parameters of the scan sequence or the realization of the scan sequence.

Figure 2:
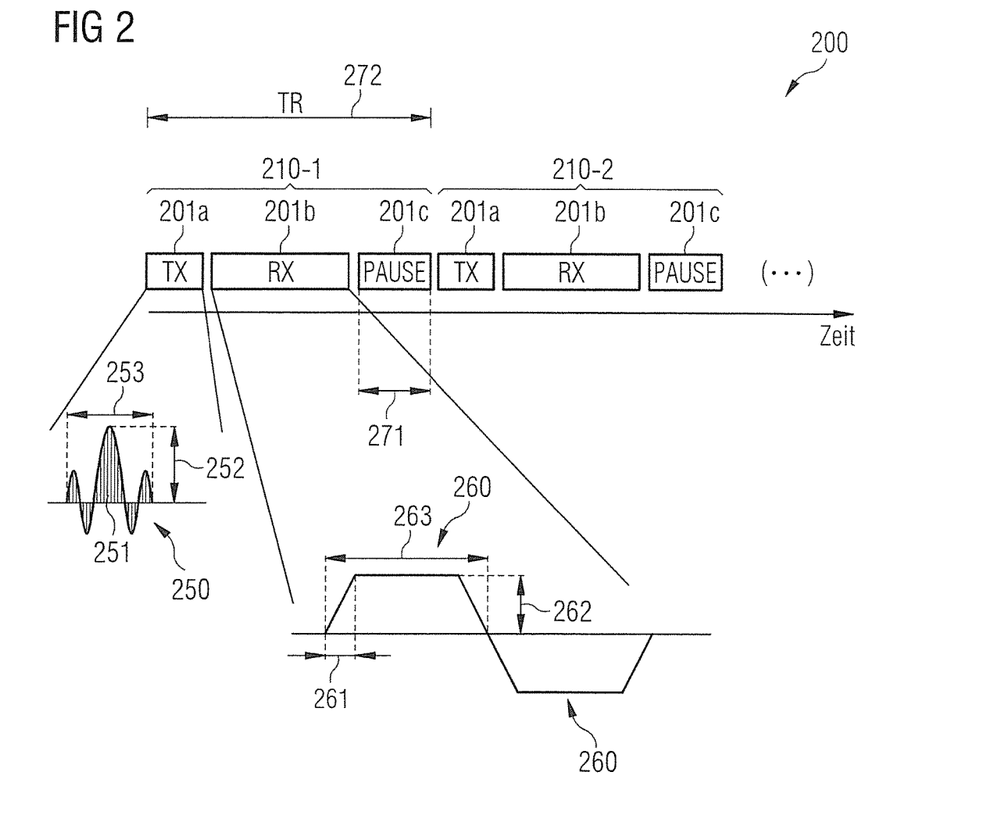
FIG. 2 shows a scan sequence that is determined by a number of scan parameters.

An exemplary scan sequence 200 is shown in FIG. 2. The scan sequence 200 acquires MR data for a number of slices 210-1, 210-2. A repetition time TR 272 per slice 210-1, 210-2 is required for this purpose. The repetition time is influenced in the scenario of FIG. 2 by a transmission block 201a, a receiving block 201b and a pause block 201c, which relates to a dead time 271. In the transmission block 201a, predominantly, excitation and possibly manipulation of the magnetization takes place. In the receiving block 201b, the acquisition of MR data of the relaxing excited magnetization takes place.

In the transmission block 201a, at least one RF pulse 250 is radiated in. Depending on the type of scan sequence 200, this can be, for example, an RF excitation pulse, an RF preparation pulse, an RF saturation pulse and/or an RF inversion pulse, etc.

The RF pulse 250 is characterized by a frequency 251, an amplitude 252, a pulse form, a transmission array setting and a duration 253. Individual, or all, of these scan parameters of the scan sequence 200 can be determined flexibly. For example, perhaps in interaction with an amplitude of a simultaneously used gradient pulse or a basic magnetic field (both not shown in FIG. 2)—the frequency 251 of the RF pulse 250 can be selected flexibly. Alternatively or additionally, it is also possible to select the amplitude 252 of the RF pulse 250 flexibly. In the case of an RF excitation pulse, a larger (smaller) amplitude 252 typically brings about a larger (smaller) flip angle of the magnetization deflected by the RF pulse 250 and thus a higher (lower) SNR of the MR image. The duration and form 253 of the RF pulse 250 typically influence the characteristics of the position encoding achieved, and thus, for example, influence a slice thickness of the slices 210-1, 210-2 or the accuracy of the slice profile.

In the receiving block 201b, also, RF pulses can be radiated in (not shown in FIG. 2), e.g. 180° RF pulses. Corresponding statements as set out above in relation to the transmission block 201a then apply.

In the receiving block 201b, in the scenario in FIG. 2, gradient pulses 260 are switched. For example, the scan sequence 200 may be a GRE scan sequence. The gradient pulses 260 then form gradient echoes. The gradient pulses 260 are characterized by an amplitude 262 and a flank or rate of change of the amplitude 262. The smaller (larger) the amplitude, the longer (shorter) the echo time, which itself finds expression in a reduced (increased) contrast in the MR image. A duration 263 of the gradient pulse 260 is also adjustable. This can be adjusted, in particular correlated with, the amplitude 262 of the gradient pulses.

The representation in FIG. 2 is exemplary for illustrative purposes. An actual scan sequence 200 according to different implementations can comprise, for example, a first dephasing gradient pulse with half moment and a second readout gradient pulse with full moment.

By means of a longer (shorter) dead time 201c, a longer (shorter) scan time can be achieved, wherein typically the longer (shorter) scan time evokes increased (reduced) movement artifacts which, in turn, brings about a worsened (improved) quality of the MR image. On the other hand, by means of a longer (shorter) dead time, a smaller (larger) correlation or negative influence (cross-talk) between the acquisition of the MR data for the different slices 210-1, 210-2 can be achieved, which can bring about an improved (worsened) quality of the MR image.

From FIG. 2, it is also apparent that the execution of the scan sequence 200 with the repetition time 272 for the plurality of slices 210-1-210-2 takes place in the examination region 181. The physical variable can describe an integration in the time space wherein the integration takes place on a time scale which lies in the order of, or is larger than, the repetition time.

Figure 3:
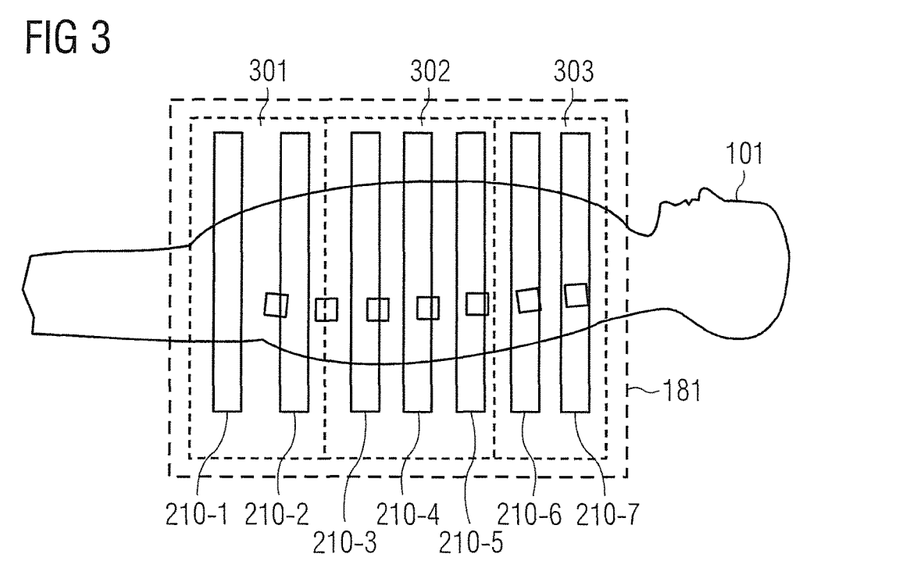
FIG. 3 shows an examination region that includes a first subregion and a second subregion.

Referring to FIG. 3, it can be thereby achieved that by suitable determination of at least one scan parameter 251, 252, 253, 261, 262, 263, 271, 272 in a first subregion 301 of the examination region 181, the pre-set threshold value of the physical variable is adhered to overall. It is therefore possible as a whole that the first value of the scan parameters for the slices 210-1, 210-2 which lie in the first subregion 301 is selected differently from the second value of the scan parameters for the slices 210-3, 210-5 which lie within the second subregion 302 of the examination region 181.

Herein, the first subregion 301 and the second subregion 302 can be determined, for example, based on an anatomical landmark recognition in reference image data of the examination region 181 and/or based on a user input at the user interface 150 of the MR system 100. The determination of the first subregion 301 and the determination of the second subregion 302 can be undertaken such that the second subregion 302 contains an anatomical structure of the person 101 under examination, who is arranged in the examination region 181, such that the first subregion 301 contains a surrounding region of the structure to be imaged. In the scenario of FIG. 3, the structure to be imaged is, for example, the fourth vertebra of the spinal column. The 1st and 2nd or 6th and 7th vertebrae of the spinal column can be useful to ascertain an anatomical orientation or positioning of the 4th vertebra; an accurate, for example, qualitative information about the anatomy of the 1st and 2nd or 6th and 7th vertebrae—beyond their position or simple presence—can be unnecessary and not, or only to a limited extent, influence a diagnosis relating to the 4th vertebra. In particular, the first value of the scan parameters can be determined such that for the first subregion 301, a relatively strongly reduced quality—e.g. as compared with the quality in the second subregion 302—is obtained.

Scenarios are also conceivable in which the first subregion 301 is arranged, for example, entirely outside the person under examination 101. Then, in the first subregion 301, only a small or insignificant proportion of signal-generating material can be present. This can be taken into account during determination of the first value of the scan parameters for the first subregion 301.

It is possible, for example, for the above described techniques to be repeated multiple times for different examination regions, each comprising a first subregion and a second subregion. For example, the different examination regions could relate to different intervertebral disks of the patient. Example: Scan in which a plurality of intervertebral disks (e.g. Nos. 3 and 7) are to be diagnosed and for which, respectively, a small surrounding region (e.g. concerning intervertebral disks Nos. 2 and 4 or 6 and 8) serve for orientation.

Highly varied concepts in relation to the first subregion 301 and the second subregion 302 have been described above. However, it is possible that more than two subregions 301, 302 are taken into account, for example, a third subregion 303 (see FIG. 3). In general, the determination of the value of the scan parameters can take place spatially resolved. This means that for different position points within the person under examination 101, different values for the at least one scan parameter are determined so that the pre-set threshold value of the physical variable is adhered to.

Figure 4:
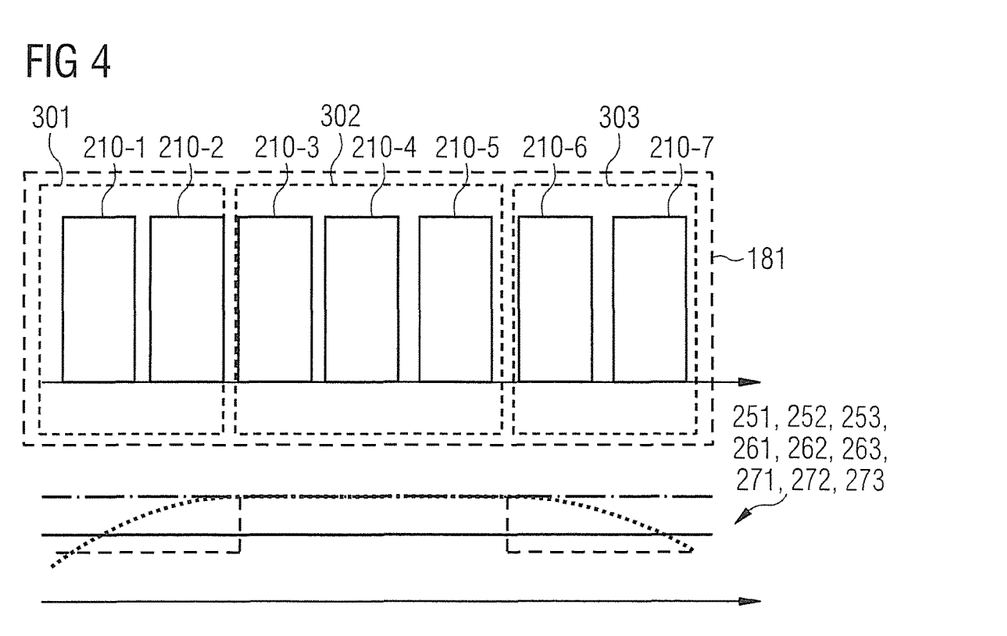
FIG. 4 schematically illustrates the determination of a first value of the scan parameter for the first subregion and the determination of a second value of the scan parameter for the second subregion, according to different embodiments of the invention.

This is described in greater detail in relation to FIG. 4. In FIG. 4, a scenario is illustrated in which initially a candidate value, for example, for the amplitude 252 of the RF pulse 250 is obtained (shown in FIG. 4 with the dot-dashed line). The candidate value can be obtained, for example, from a prior planning of the scan protocol.

It is apparent from FIG. 4 that the candidate value—independently of the slice 210-1-210-7—is constant and equal in all the subregions 301, 302, 303. This is the case since particular limit conditions or requirements for the quality of the MR image are adhered to with the candidate value. The relevant quality of the MR image brings about, for example, an information content of the anatomy being imaged which is sufficient for a subsequent diagnosis or finding. In the example of FIG. 4, the candidate value for the amplitude 252 is selected relatively large; this corresponds to a large flip angle of the magnetization and thus a higher quality of the MR image.

The candidate value of the amplitude 252 has the effect, however, that the pre-set threshold value for the mean RF energy is not adhered to. It is therefore required to adjust file amplitude 252 of the RF pulse 250 relative to the candidate value. According to different reference implementations, this takes place evenly for the different subregions 301, 302, 303 (shown in FIG. 4 with the continuous line). This has the result that the quality of the MR image in all the subregions 301, 302, 303 or in the whole examination region 181 is reduced relative to the quality that would be achieved by means of the candidate value. This can have disadvantageous consequences for the information content in the MR image and the possibility of subsequently achieving a conclusive diagnosis on the basis of the MR image.

According to the techniques described herein, the candidate value is selectively adjusted in the first subregion 301 and the third subregion 303 in order to obtain the first value of the amplitude 252 of the RF pulse 250, whereas the candidate value is used in the second subregion 302 as the second value of the amplitude 252 of the RF pulse 250 and is therefore not adjusted. This has the result that the quality of the MR image in the second subregion 302 is not reduced in relation to the quality of the MR image that would be achieved by means of the candidate value. By this means, it is possible to provide a relatively high information content for the anatomically more relevant region. A subsequent diagnosis can be carried out accurately and reliably. Nevertheless, the technical efficiency such as the maximum amplification of the RF transmitter unit 131 and/or the physiological limitation such as the heating of tissue by RF radiation can be maintained globally.

It is also possible for the determination of the first value of the at least one scan parameter 251, 252, 253, 261, 262, 263, 271, 272 in the first subregion 301 and the third subregion 303 to take place spatially resolved (shown with the dotted line in FIG. 4). For example, the adjustment of the candidate value in the first subregion 301 and the third subregion 303—as in the example described above—can be carried out spatially resolved, specifically such that the candidate value in the first subregion 301 and the third subregion 303 is adjusted by a larger amount the greater a distance of a corresponding position point in the first subregion 301 or the third subregion 303 is from the second subregion 302. In general, therefore, in place of a step function transition between the first subregion 301 or the third subregion 303 and the second subregion 302, a continuously varying determination of the value of the scan parameters 251, 252, 253, 261, 262, 263, 271, 272 can take place. This can bring about advantageous effects in relation to an overall impression of the MR image. A transition in the quality of the MR image between the first subregion 301 and the second subregion 302 is then less sudden.

For example, it is possible for a local rate of change of the second value of the at least one scan parameter 251, 252, 253, 261, 262, 263, 271, 272 to be undertaken depending on the threshold value comparison between the value of the physical size and the pre-set threshold value. Alternatively or additionally, the rate of change can be determined depending on a user input by a user at the user interface 150 or heuristically, for example, based on the anatomy to be imaged. For example, the local rate of change can be selected to be higher (lower) the more severe the non-adherence of the technical efficiency and/or physiological limitation is discovered to be through the threshold value comparison.

Depending on the time scale of the integration of the physical variable, in the scenario of FIG. 4, a sequence with which the MR data are acquired for the slices 210-1-210-7 can be relevant. In a simple example, the time scale is significantly larger than the repetition time 272 and the scan time. Then, a sequence with which the MR data are acquired for the slices 210-1-210-7 can be arbitrary. For example, the slices 210-1-210-7 in FIG. 4 can be acquired sequentially from left to right.

It is also possible, however, for the time scale of the integration to lie approximately in the order of the repetition time 272. It may therefore be desirable to acquire the slices

210-1, 210-2 which lie in the first subregion 301 nested in relation to the slices 210-3, 210-4, 210-5 which lie within the second subregion 302. In this way, also, it can be ensured that the pre-set threshold value is adhered to. The sequence in which the slices are scanned can therefore constitute a scan parameter which determines the scan sequence.

Figure 5:
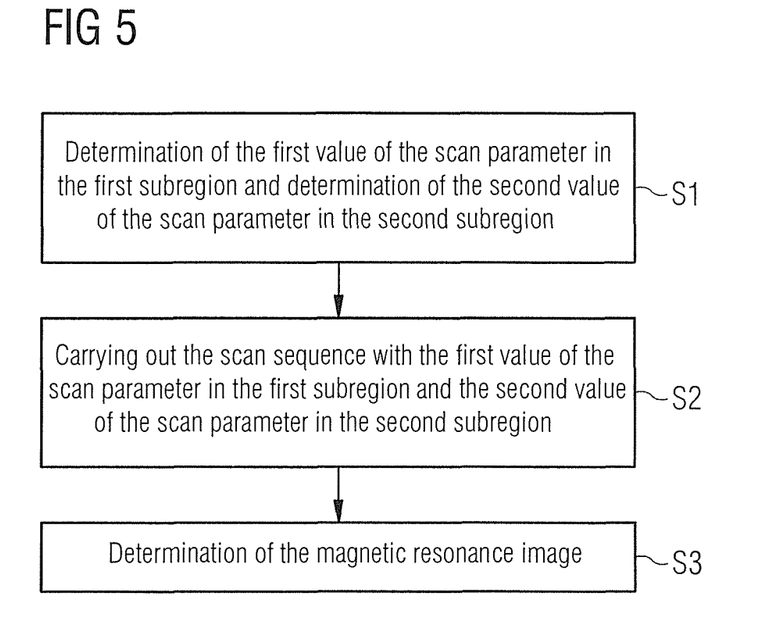
FIG. 5 is a flowchart of an embodiment of the method according to the invention.

In FIG. 5, a method for determining the MR image by carrying out the scan sequence 200 is shown. The method begins at step S1. Firstly, in step S1, the first value of the scan parameter 251, 252, 253, 261, 262, 263, 271, 272 is determined in the first subregion 301 and the value of the second scan parameter is determined in the second subregion 302. The determination therefore takes place spatially resolved.

Herein, the determination of the first value and of the second value takes place in that the value of the physical variable contains the pre-set threshold value. For example, the determination of the first value and of the second value can take place in step S1 on the basis of a pre-determined function which takes account of the pre-set threshold value as the input variable; in this way, the first value and the second value of the scan parameter 251, 252, 253, 261, 262, 263, 271, 272 can be determined computationally and, simultaneously, it can be ensured that the pre-set threshold value is adhered to. It is also possible that in step S1 numerical and/or iterative techniques are used. For example, step S1 can include an optimization. For example, a candidate value from a conventional planning of the scan protocol can be obtained as an input parameter.

In step S2, the scan sequence 200 is carried out. Herein, the first value of the scan parameter 251, 252, 253, 261, 262, 263, 271, 272 is used in the first subregion 301 and the second value of the scan parameter 251, 252, 253, 261, 262, 263, 271, 272 is used in the second subregion 302.

Then, in step S3, the determination of the MR image takes place. For example, the MR image could be output on a screen of the user interface 150 of the MR system 100. It is herein possible, for example, that in the MR image, the first subregion 301 and/or the second subregion 302 are indicated graphically emphasized. This may enable the user to carry out a particularly accurate and reliable diagnosis on the basis of the MR image. In particular, it can be prevented that the user carries out a diagnosis on the basis of information from the first subregion 301 which has, for example, a lower quality in comparison with the second subregion 302. Nevertheless, it can be made possible for a user to use the information content of the MR image in the first subregion 301 for anatomical orientation.

Figure 6:
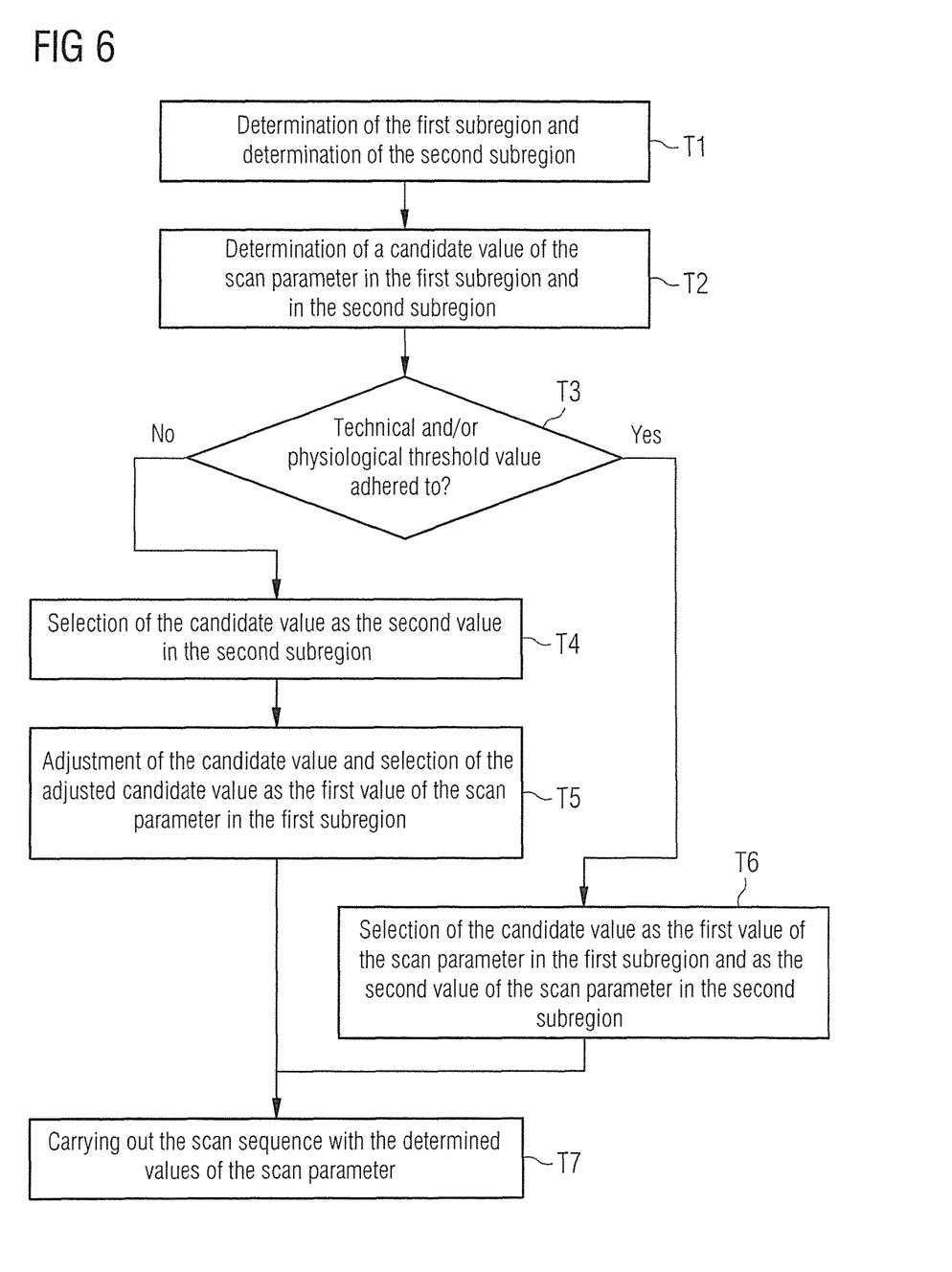
FIG. 6 is a flowchart of a further embodiment of the method according to the invention.

In FIG. 6, a further embodiment of the method for determining the MR image is shown. Firstly, in step T1, manual or automatic determination of the first subregion 301 and of the second subregion 302 takes place. The first subregion 301 and the second subregion 302 can herein be determined such that the first subregion 301 contains the regions of the examination region 181 in which a quality of the MR image may be comparatively low; accordingly, the second subregion 302 can denote those regions of the examination region 181 in which the quality should be comparatively high. For example, it is possible for the first subregion 301 to be determined such that it includes those regions of the examination region 181 in which a reduced contrast of the MR image may be achieved. A third subregion 303 or further subregions could also be taken into account.

Firstly, in step T2, the determination of the candidate value of the scan parameter 251, 252, 253, 261, 262, 263, 271, 272 takes place in the first subregion 301 and in the second subregion 302. In a simple implementation, the candidate value is a "global" value, i.e. it has no position-dependency and is constant and equal in the different subregions 301, 302, 303 of the examination region 181. It is, however, also possible that the candidate value already has a position-dependency. For example, the candidate value can have a value of the scan parameter which is optimized "dynamically" and locally with respect to the quality of the MR image; see, for example, the published application DE 10 2009 020 661 A1 mentioned in the introduction. Herein, typically, the candidate value of the scan parameter is determined such that in the whole examination region, the best possible quality of the MR image is achieved.

Then, in step T3, it is checked whether the value of the physical variable adheres to the pre-set threshold value. For this purpose, the value of the physical variable is determined on the basis of the candidate value. This can be carried out, for example, on the basis of a pre-determined function. The determination of the value of the physical variable can comprise, for example, an integration over time, so that the candidate value is to be taken into account both in the first subregion and also in the second subregion. The check in step T3 takes account of whether the pre-set threshold value is adhered to in the whole examination region 181.

If the pre-set threshold value is adhered to, then in step T6, the candidate value is selected as the first value and as the second value of the scan parameter. Adjustment of the candidate value does not take place. In step T7, the scan sequence is carried out.

If, however, the pre-set threshold value is not adhered to in step T3, then steps T4 and T5 are carried out. In step T4, firstly the second value of the scan parameter is selected as the candidate value in the second subregion 302. By this means, it is ensured that in the second subregion 302, a reduction in the quality of the MR image as compared with the candidate value is not brought about.

In step T5, the candidate value is adjusted and the adjusted candidate value is selected as the first value of the scan parameter in the first subregion 301. The adjustment of the candidate value herein takes place such that the pre-set threshold value is adhered to, i.e. that a technical efficiency and/or a physiological limitation are no longer exceeded. The extent of the adjustment thus takes place dependent upon the threshold value comparison.

In this embodiment, it is possible for the candidate value in the first subregion to be reduced only to a particular level, such that the image quality enables at least an orientation. If this setting of the threshold value cannot yet be adhered to, the candidate value in the second subregion can also be adjusted, for example, also only to a particular level, so that the image quality at least enables a diagnosis.

Then, in step T7, the scan sequence is carried out with the determined values of the scan parameter, i.e. in the case of step T4 and T5, with the adjusted candidate value as the first value of the scan parameter in the first subregion 301.

Optionally, it would be possible to use different approaches known from the prior art for adhering to the pre-set threshold value, thus for example, a global adjustment of the first and second values of the scan parameter.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance (MR) image, comprising:

using a processor to prepare a scan sequence for operating an MR scanner in order to obtain acquired MR data from an examination region of an examination object, said scan sequence comprising at least on scan parameter;

in said processor, when preparing said scan sequence, automatically determining a first value of said at least one scan parameter for a first subregion of the examination region, and determining a second value of said at least one scan parameter for a second subregion of the examination region;

in said processor, also when preparing said scan sequence, determining each of said first value and said second value so as to cause a value of a physical variable, that is influenced by the first value and the second value of the at least one scan parameter, to adhere to a predetermined threshold value;

in said processor, generating control signals corresponding to said scan sequence, with the determined first and second values, and providing said control signals from said processor to said MR scanner and thereby operating said MR scanner with so as to execute scan sequence while the examination object is situated in the MR scanner, with said first value of said at least one scan parameter in said first subregion and with said second value of said at least one scan parameter in said second subregion, to obtain said acquired MR data for the examination region; and in said processor, reconstructing an MR image of the examination region from the acquired MR data, and making the reconstructed MR image available in electronic form as a data file from said processor.

2. The method as claimed in claim 1 wherein said first value of said at least one scan parameter causes a reduced quality of said MR image in said first subregion, with respect to a quality of the MR image in said second subregion caused by said second value of said at least one scan parameter.

3. The method as claimed in claim 1 comprising determining said first value of said at least one scan parameter dependent on a proportion of MR signal-generating material in said first subregion.

4. The method as claimed in claim 1 comprising determining said first value and said second value of said at least one scan parameter by:

obtaining a candidate value of said at least one scan parameter;

determining a value of the physical variable dependent on said candidate value;

making a threshold value comparison between the determined value of the physical variable and the predetermined threshold value, thereby obtaining a comparison result; and dependent on said comparison result, selectively adjusting said candidate value in said first subregion to obtain said first value of said at least one scan parameter, and using said candidate value in said second subregion as said second value of said at least one scan parameter.

5. The method as claimed in claim 1 comprising determining each of said first subregion and second subregion from at least one source selected from the group consisting of an anatomical landmark in reference image data of the examination region, and a user entry via a user interface of said processor.

6. The method as claimed in claim 5 comprising:

determining said first subregion and said second subregion so that said second subregion contains a structure of the examination object, desired to be shown in said MR image; and determining said first subregion and said second subregion so that said first subregion contains a surrounding environment of said structure.

7. The method as claimed in claim 1 comprising determining said first value of said at least one scan parameter spatially resolved within said first subregion.

8. The method as claimed in claim 1 comprising, in said processor:

obtaining a spatially resolved candidate value for said first value of said at least one scan parameter, that is spatially resolved in said first subregion;

determining a value of the physical variable dependent on said spatially resolved candidate value of said first value of said at least one scan parameter;

making a threshold value comparison between the determined value of the physical variable and the predetermined threshold value, thereby obtaining a comparison result;

dependent on said comparison result, selectively adjusting said spatially resolved candidate value in the first subregion with adjustment by a larger amount the greater a distance of a respective position in said first subregion is from said second subregion; and also obtaining a candidate value of said second value of said at least one scan parameter in said second subregion and using said candidate value as said second value said at least one scan parameter.

9. The method as claimed in claim 1 comprising:

operating said MR scanner to obtain said acquired MR data by, in said scan sequence, radiating at least one radio-frequency pulse having a duration, an average energy and an amplitude, activating at least one gradient pulse that produces a gradient field having an average field strength and a rate of change of said field strength, providing a dead time between successive acquisitions of the acquired MR data, and acquiring said acquired MR data during an echo time and from at least one slice of the examination object; and selecting said at least one scan parameter from the group consisting of the amplitude and average energy of said at least one radio-frequency pulse, the duration and the average energy of said at least one radio-frequency pulse, the dead time and the average energy of said radio-frequency pulse, a pulse configuration and the average energy of said at least one radio-frequency pulse, a transmission array setting for radiating said at least one radio-frequency pulse and the average energy of said at least one radio-frequency pulse, a number of said radio-frequency pulses and the average energy thereof, the amplitude of said gradient pulse and the average field strength of said gradient field, the dead time and the average field strength of the gradient field, a duration of said gradient pulse and the average field strength of the gradient field, a pulse configuration of said gradient pulse and said average field strength of said gradient field, a gradient offset current that compensates for a field inhomogeneity of a basic magnetic field in said MR scanner and the average field strength of the gradient field, said echo time and the average field strength of the gradient field, a slice thickness of said at least one slice and the average rate of change of the field strength of the gradient field, the echo time and the average rate of change of the field strength of the gradient field, the rate of change of an amplitude of said gradient pulse and the average rate of change of the field strength of the gradient field, the dead time and the average rate of change of the gradient field, and a plurality of different slices from which said acquired MR data are acquired and the average energy of said at least one radio-frequency pulse.

10. The method as claimed in claim 9 comprising selecting said gradient pulse from the group consisting of a spoiler gradient pulse and a preparation gradient pulse.

11. The method as claimed in claim 1 comprising:
operating said MR scanner to execute said scan sequence with a repetition time for a plurality of slices in the examination region; and
selecting said physical variable to describe an integration over time that occurs on a time scale that is at least as large as said repetition time.

12. The method as claimed in claim 1 comprising predetermining said predetermined threshold value dependent on a technical efficiency of said MR scanner.

13. The method as claimed in claim 1 comprising determining said predetermined threshold value dependent on a physiological limitation of the examination object.

14. The method as claimed in claim 1 comprising displaying said MR image at a display screen in communication with said processor, with a designation in said MR image of at least one of said first subregion and said second subregion.

15. The method as claimed in claim 1 wherein said physical variable describes an integration with respect to spatial dimensions on a spatial scale that is at least as large as said examination object.

16. A magnetic resonance (MR) apparatus comprising:
an MR scanner;
a processor that prepares a scan sequence in order to operate the MR scanner to obtain acquired MR data from an examination region of an examination object, said scan sequence comprising at least one scan parameter;
said processor, when preparing said scan sequence, automatically determining a first value of said at least one scan parameter for a first subregion of the examination region, and to determine a second value of said at least one scan parameter for a second subregion of the examination region;
said processor, also when preparing said scan sequence, determining each of said first value and said second value so as to cause a value of a physical variable, that is influenced by the first value and the second value of the at least one scan parameter, to adhere to a predetermined threshold value;
said processor generating control signals corresponding to said scan sequence, with the determined first and second values, and providing said control signals from said processor to said MR scanner and thereby operating said MR scanner with said scan sequence while the examination object is situated in the MR scanner, with said first value of said at least one scan parameter in said first subregion and with said second value of said at least one scan parameter in said second subregion, to obtain said acquired MR data for the examination region; and
said processor reconstructing an MR image of the examination region from the acquired MR data, and making the reconstructed MR image available in electronic form as a data file from said processor.

* * * * *